(12) United States Patent  
deVilliers et al.

(10) Patent No.: US 8,815,747 B2
(45) Date of Patent: Aug. 26, 2014

(54) METHODS OF FORMING PATTERNS ON SUBSTRATES

(75) Inventors: Anton deVilliers, Boise, ID (US); Scott Sills, Boise, ID (US)

(73) Assignee: Micron Technology, Inc., Boise, ID (US)

(*) Notice: Subject to any disclaimer, the term of this patent is extended or adjusted under 35 U.S.C. 154(b) by 267 days.

(21) Appl. No.: 12/793,496

(22) Filed: Jun. 3, 2010

(65) Prior Publication Data

US 2011/0297646 A1  Dec. 8, 2011

(51) Int. Cl.
*H01L 21/302* (2006.01)

(52) U.S. Cl.
USPC ............ 438/725; 438/717; 438/781; 430/313

(58) Field of Classification Search
USPC ......... 438/639, 696, 700, 706, 725, 734, 646, 438/736, 780, 781; 430/310, 312–3, 313
See application file for complete search history.

(56) References Cited

U.S. PATENT DOCUMENTS

| | | | | |
|---|---|---|---|---|
| 6,107,161 | A * | 8/2000 | Kitaguro et al. | 438/462 |
| 6,168,907 | B1 * | 1/2001 | Choi et al. | 430/323 |
| 6,361,928 | B1 * | 3/2002 | Yang et al. | 430/328 |
| 6,955,961 | B1 | 10/2005 | Chung | |
| 7,378,215 | B2 | 5/2008 | Yamaguchi et al. | |
| 7,521,808 | B2 * | 4/2009 | Furukawa et al. | 257/774 |
| 7,923,373 | B2 | 4/2011 | Sandhu | |
| 2007/0004101 | A1 * | 1/2007 | Lim | 438/149 |
| 2008/0057445 | A1 | 3/2008 | Brueck et al. | |
| 2008/0064213 | A1 * | 3/2008 | Jung | 438/696 |
| 2008/0220600 | A1 | 9/2008 | Alapati et al. | |
| 2008/0220616 | A1 * | 9/2008 | Matsui et al. | 438/736 |
| 2008/0274413 | A1 * | 11/2008 | Millward | 430/5 |
| 2008/0299487 | A1 | 12/2008 | Chang | |
| 2008/0299774 | A1 | 12/2008 | Sandhu | |
| 2009/0017628 | A1 | 1/2009 | Kim et al. | |
| 2009/0053657 | A1 * | 2/2009 | Hatakeyama et al. | 430/324 |
| 2009/0227057 | A1 * | 9/2009 | Suzuki | 438/34 |

(Continued)

FOREIGN PATENT DOCUMENTS

KR   10-2009-0102218   9/2009
KR   10-2009-0106884   10/2009
WO   PCT/US2011/035721   3/2012

OTHER PUBLICATIONS

Self-Assembled Monolayers on Polymer Surfaces: Kinetics, Functionalization, and Photopatterning; Bhme et al., Langmuir vol. 15, No. 16; Jun. 10, 1999; 5323-5328.

(Continued)

*Primary Examiner* — Lan Vinh
(74) *Attorney, Agent, or Firm* — Wells St. John, P.S.

(57) ABSTRACT

A method of forming a pattern on a substrate includes forming spaced features over a substrate. A polymer is adsorbed to outer lateral surfaces of the spaced features. Either material of the spaced features is removed selectively relative to the adsorbed polymer or material of the adsorbed polymer is removed selectively relative to the spaced features to form a pattern on the substrate. In one embodiment, the polymer is of known chain length and has opposing longitudinal ends. One of the longitudinal ends of the polymer adsorbs to the outer lateral surfaces whereby the adsorbed polymer projects lengthwise from the outer lateral surfaces, with said chain length defining a substantially uniform lateral thickness of the adsorbed polymer on the spaced features. Additional embodiments are contemplated.

47 Claims, 9 Drawing Sheets

(56) References Cited

U.S. PATENT DOCUMENTS

| | | |
|---|---|---|
| 2009/0239382 A1 | 9/2009 | Zhu |
| 2010/0028801 A1 | 2/2010 | Holmes et al. |
| 2010/0068657 A1* | 3/2010 | Yang .................... 430/323 |
| 2010/0163180 A1 | 7/2010 | Millward |
| 2010/0170870 A1* | 7/2010 | Lee et al. ................ 216/44 |
| 2011/0033786 A1 | 2/2011 | Sandhu |

OTHER PUBLICATIONS

Self-Assembled Monolayers on Polymer Surfaces; Manoj Chaudhury; Elsevier Science Ltd.; Boisensors & Bioelectronics 10; 1995; pp. 785-788.

Lai et al.; Computational Aspects of Optical Lithography Extension by Directed Self-Assembly; Proc. SPIE 8683, Optical Microlithography XXVI, Apr. 12, 2013; pp. 1-13.

McLellan, P.; Directed Self-Assembly; SemiWiki.com; Jul. 19, 2012; 2 pp.

Tiron et al.; The potential of block copolymer's directed self-assembly for contact hole shrink and contact multiplication; Proc. of SPIE vol. 8680; Mar. 26, 2013; 12 pp.

Yang et al.; Complex self-assembled patterns using sparse commensurate templates with locally varying motifs; Nature Nanotechnology; www.nature.com/naturenanotechnology; 2010; pp. 1-5.

US 8,123,960, 02/2012, Millward (withdrawn)

* cited by examiner

_Fig 2_

_Fig 3_

_Fig. 4_

_Fig. 5_

_Fig. 12_

_Fig. 13_

METHODS OF FORMING PATTERNS ON SUBSTRATES

TECHNICAL FIELD

Embodiments disclosed herein pertain to methods of forming patterns on substrates.

BACKGROUND

Integrated circuits are typically formed on a semiconductor substrate such as a silicon wafer or other semiconducting material. In general, various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking commonly known as photoresist. Such materials can be processed to modify their solubility in certain solvents, and are thereby readily usable to form patterns on a substrate. For example, portions of a photoresist can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized. Further, patterns may be formed on substrates without using photoresist.

The continual reduction in feature sizes places ever greater demands on the techniques used to form the features. For example, photolithography is commonly used to form patterned features, such as conductive lines. A concept commonly referred to as "pitch" can be used to describe the sizes of the repeating features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one method for extending the capabilities of photolithographic techniques beyond their minimum pitch. Such forms features narrower than minimum photolithography resolution by depositing one or more spacer-forming materials to have a total lateral thickness which is less than that of the minimum capable photolithographic feature size. The spacer-forming materials are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

DETAILED DESCRIPTION OF EXAMPLE EMBODIMENTS

Figure 1:
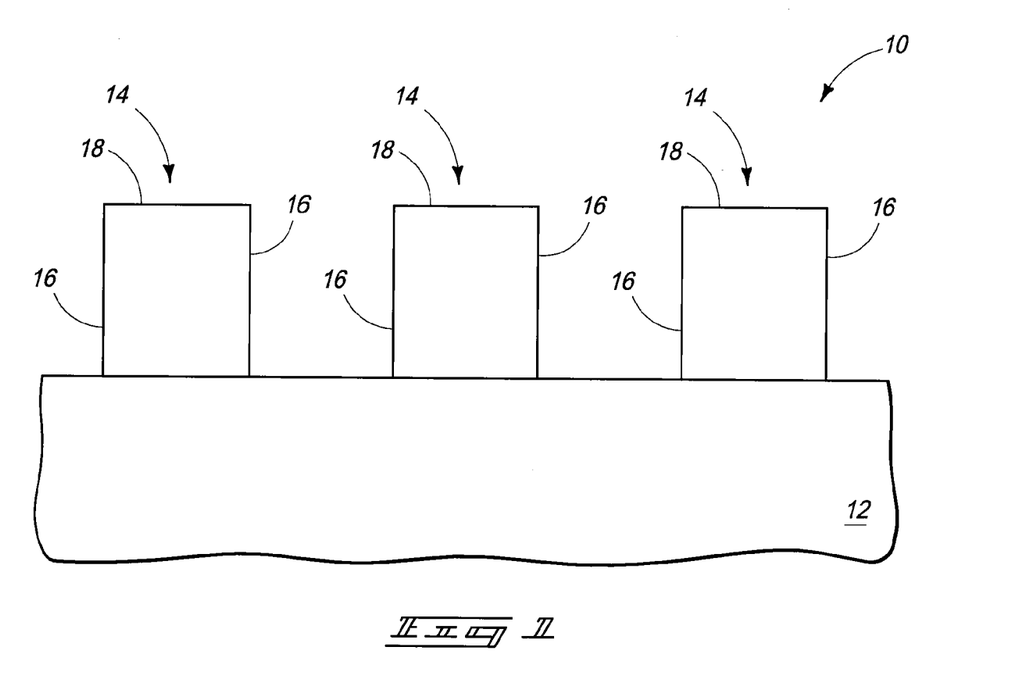
FIG. 1 is a diagrammatic sectional view of substrate in process in accordance with an embodiment of the invention.

Example methods of forming patterns on substrates of some embodiments of the invention are initially described with reference to FIGS. 1-5. Referring to FIG. 1, a substrate fragment is indicated generally with reference numeral 10. Such may comprise a semiconductor or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Additional examples include quartz, sapphire, etc.

Substrate fragment 10 comprises substrate material 12 which may be homogenous or non-homogenous and include any of conductive, semiconductive, and insulating materials. Such might, for example, be used in the fabrication of integrated circuitry. Spaced features 14 have been formed over substrate 12, and may be homogenous or non-homogenous. Such may be partially or wholly sacrificial, and accordingly may or may not comprise a part of a finished circuitry construction where circuitry is being fabricated. Spaced features 14 may be fabricated by any existing or yet-to-be developed technique. Examples include lithography, for example photolithography. Spaced features 14 may or may not comprise photoresist. Regardless, outermost surfaces of features 14 may be hardened or otherwise treated after initial formation. Spaced features 14 may be patterned at, greater than, or less than the minimum photolithographic resolution with which substrate 10 is fabricated. Spaced features 14 are shown as being of the same size, shape and spacing relative one another and as being generally rectangular in cross-section. Other shapes, differing shapes among the features, and two or more different spacings may be used. Individual of the spaced features 14 may be considered as comprising opposing outer lateral sidewall surfaces 16 and an elevationally outer top wall or surface 18. In one embodiment, sidewalls 16 are generally parallel one another. In one embodiment, sidewalls 16 are generally parallel one another and extend generally orthogonally relative to substrate 12. In one embodiment, one or both of outer surfaces 16 and 18 comprise photoresist.

Figure 2:
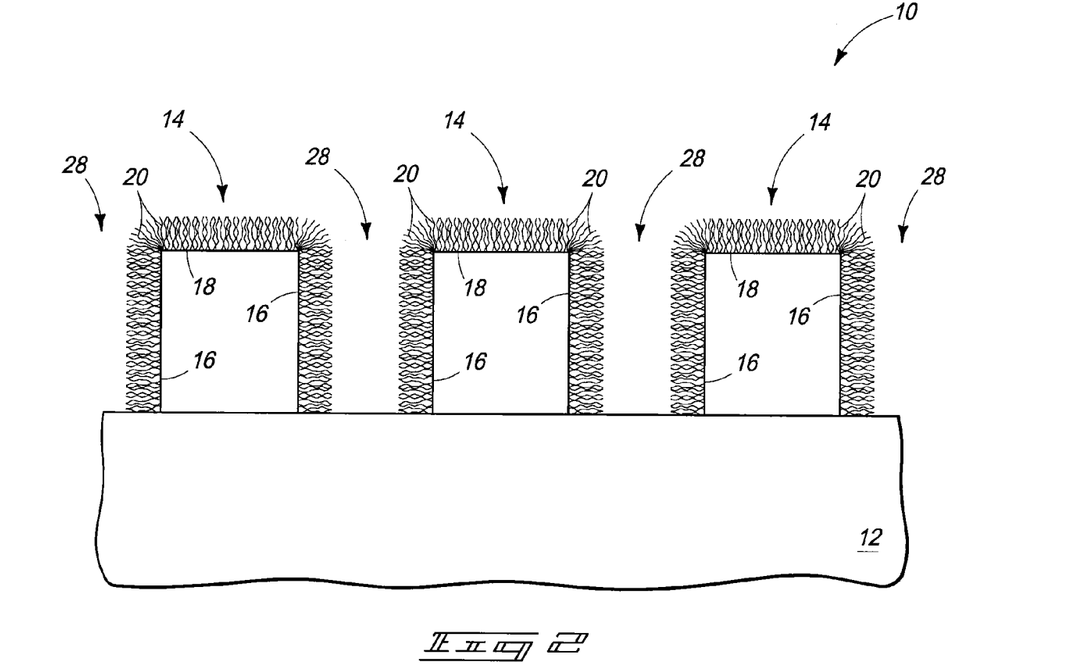
FIG. 2 is a view of the FIG. 1 substrate at a processing step subsequent to that shown by FIG. 1.
Figure 3:
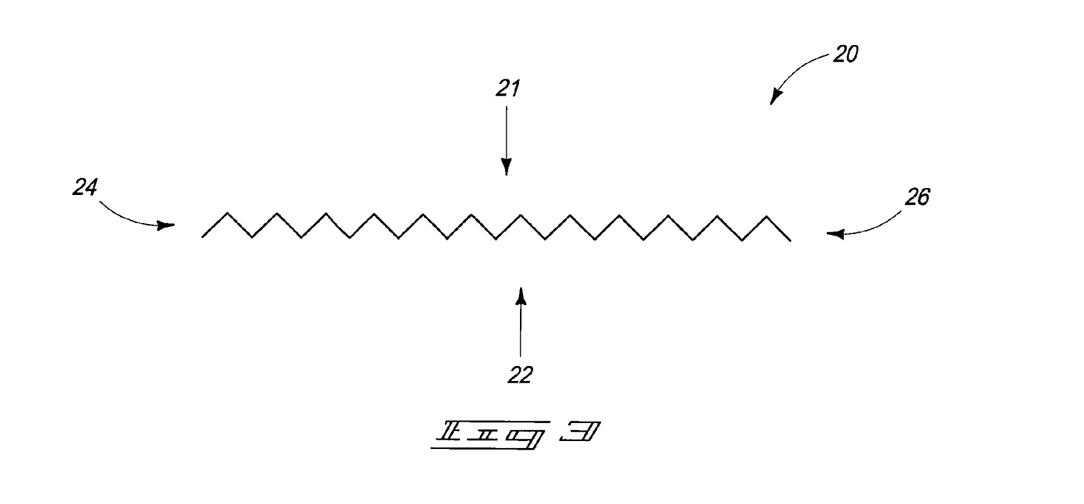
FIG. 3 is an enlarged view of a polymer of FIG. 2.

Referring to FIG. 2, a polymer 20 has been adsorbed to outer lateral surfaces 16 of spaced features 14. Further in one embodiment and as shown, polymer 20 is adsorbed to elevationally outer surfaces 18 of spaced features 14. In the context of this document, a polymer is an elongate molecule having a chain of chemically bonded monomers. By way of example, FIG. 3 diagrammatically depicts polymer 20 as having opposing sides 21 and 22, and opposing longitudinal ends 24 and 26. In one embodiment, the polymer is of known or predetermined chain length, with one of longitudinal ends 24, 26 adsorbing to outer lateral surfaces 16 whereby the adsorbed polymer projects lengthwise from such outer lateral surfaces with the polymer chain length defining a substantially uniform lateral thickness of the adsorbed polymer on the spaced features. FIG. 2 depicts one such example. FIG. 2 also depicts an example whereby lengthwise polymer projection is generally in an orthogonal or normal manner relative to major surfaces 16 and 18. Alternate embodiments where lengthwise projecting occurs may be used, for example at a different uniform angle to such major surfaces (FIG. 12) and/or in a coiled ensemble manner (FIG. 13) such as may occur with or analogous to grafted polymer brushes.

In one embodiment, polymer 20 between immediately adjacent spaced features 14 does not fill the space therebetween, and thereby provides a void space 28 between immediately adjacent of spaced features 14. In one embodiment, all polymer that is adsorbed to outer lateral surfaces 16 consists essentially of a single composition polymer. The lateral width or thickness of polymer 20 adhered to outer surfaces 16, 18 may be determined by the molecular chain lengths of the polymer (N*b), where N is degree of polymerization and b is a statistical segmental length, with the product thereof ranging from 1 nanometer to 10 nanometers in one example embodiment. Polymer 20 will likely adsorb in a manner in which sidewalls thereof contact or interact with immediately adjacent polymer molecules. Regardless, the adsorbing may be by one or both of physisorbing or chemisorbing.

In one embodiment, the polymer comprises one longitudinal end which is philic to composition of the outer lateral feature surfaces and adsorbs thereto. In one embodiment, the polymer comprises one longitudinal end which is phobic to composition of the outer lateral feature surfaces, and in one embodiment is also hydrophobic generally. In one embodiment, the polymer is an amphiphile. In one embodiment, the polymer is an oligomer. In one embodiment, the polymer is a copolymer, for example, a block copolymer or a graft copolymer. Regardless, the polymer may be chemically functionalized to provide desired phobicity and phyllicity using methods known in the art of synthetic chemistry.

Regardless of polymer chain length, polymer selection may depend upon composition of outer surfaces 16 and 18 to which a polymer adsorbs. As examples, deep ultraviolet positive resists commonly comprise methacrylate or cycloolefin-maleic anhydride co-polymers. For such materials, example amphiphilic polymers include perfluoroalkyl sulfonates or fluorinated organosilicon compounds. Example block copolymers include a polar block that adsorbs to the resist outer surface (for example polymethylmethacrylate, polyethyleneoxide, polyethylamide, polyethylstyrene, etc.) combined with either a non-polar outer block (polystyrene, polyethylene, polypropylene, etc.) or a fluoropolymer outer block (for example perfluoroalkanes or poly(pentafluoro styrene)).

Figure 4:
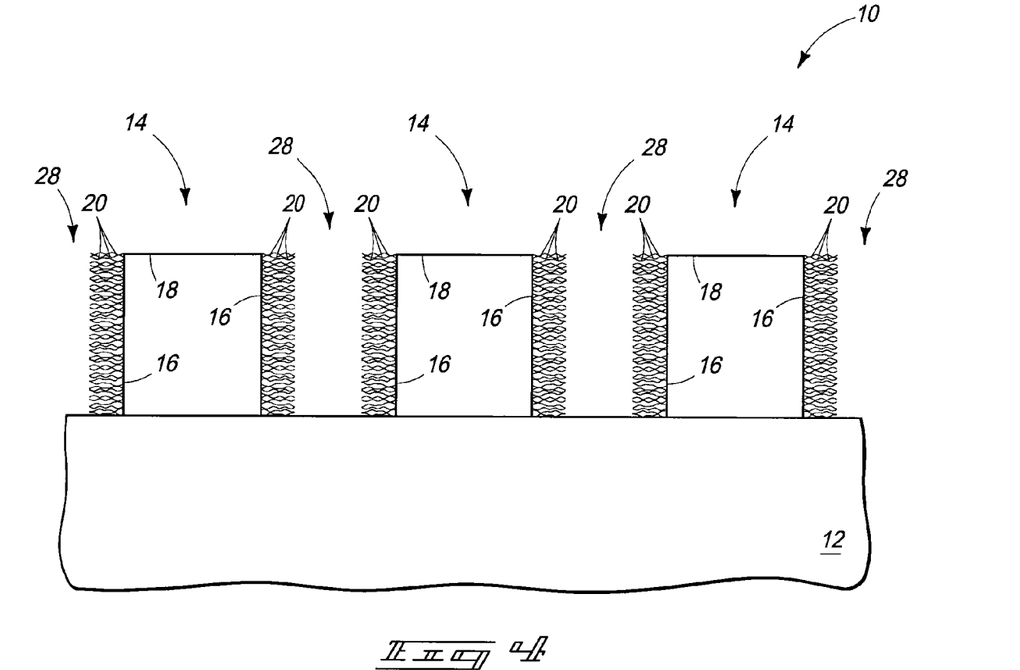
FIG. 4 is a view of the FIG. 2 substrate at a processing step subsequent to that shown by FIG. 2.
Figure 5:
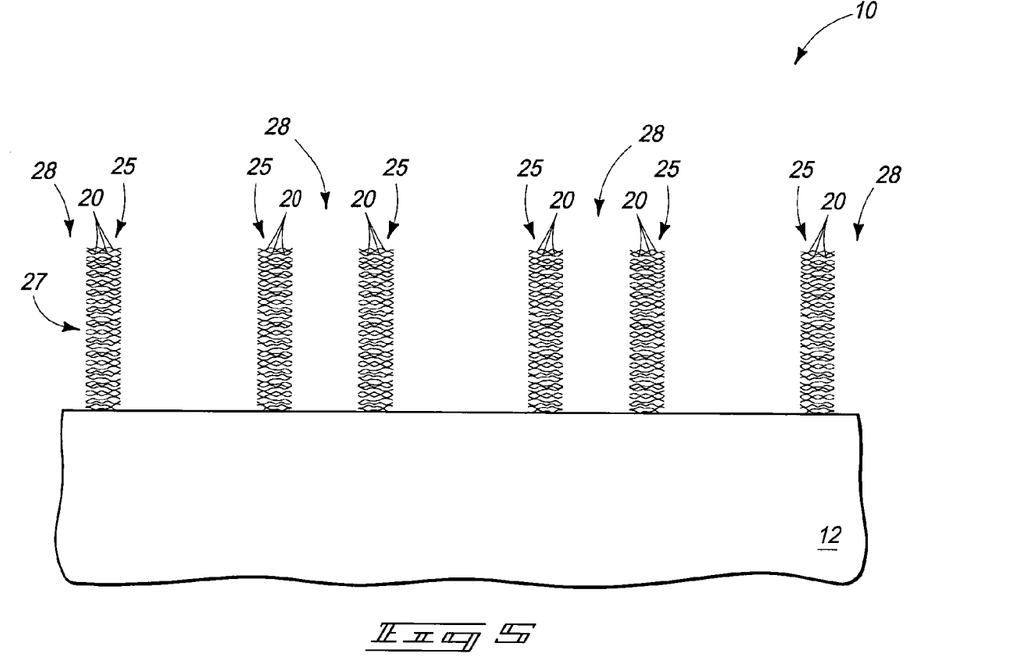
FIG. 5 is a view of the FIG. 4 substrate at a processing step subsequent to that shown by FIG. 4.

After the adsorption of the polymer to the outer lateral surfaces of the spaced features, either material of the spaced features is removed (i.e., by etching or solvating) selectively relative to the adsorbed polymer or material of the adsorbed polymer is removed (i.e., by etching or solvating) selectively relative to the spaced features, and regardless forms a pattern on the substrate. In the context of this document, a selective removal requires removal of one material relative to another at a differential etch rate of at least 1.5. As examples, adsorbed polymer 20 of FIG. 2 could be polished and/or anisotropically etched back at least to elevationally outer surface 18 and thereby expose material of spaced features 14 (FIG. 4). A timed chemical etch may or may not be conducted to reduce the elevational thickness of the adsorbed polymer above substrate material 12 along outer lateral surfaces 16 (not shown). Regardless, FIG. 5 shows example subsequent removal of all of the material of spaced features 14 (not shown) selectively relative to polymer 20, resulting in spaced features 25 which comprise a mask pattern 27 received over substrate 12. In other embodiments, spaced features 25 may comprise sites for subsequent chemical modification or selective chemical processing, for example staining for enhanced etch selectivity or for selective deposition of functional components in directed self-assembly.

Figure 6:
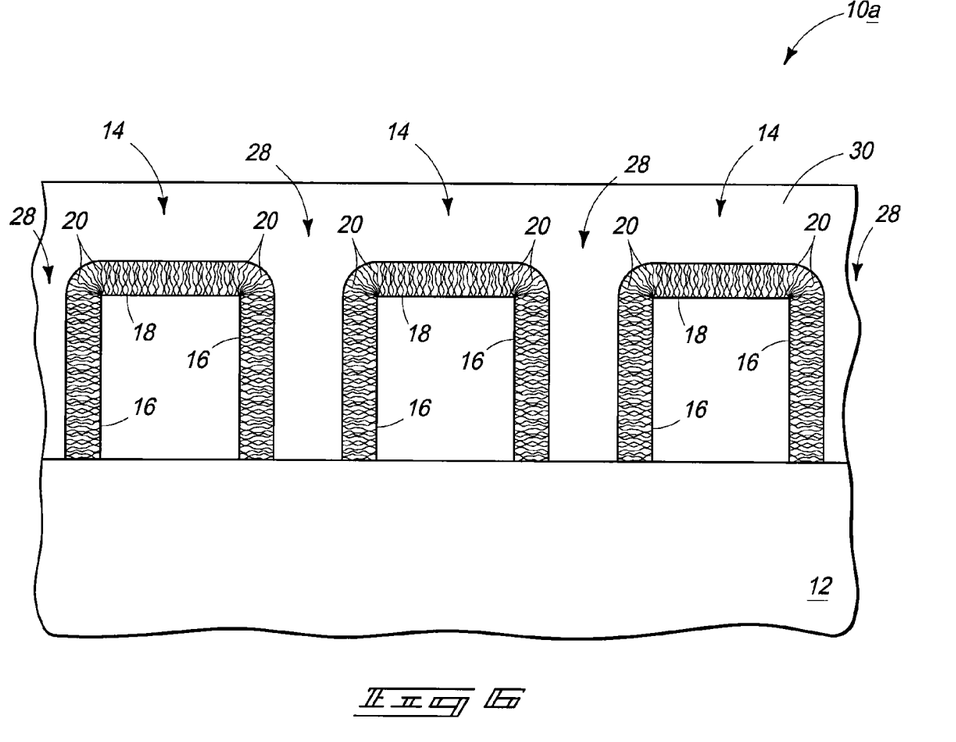
FIG. 6 is a diagrammatic sectional view of an alternate embodiment substrate in process in accordance with an embodiment of the invention.
Figure 7:
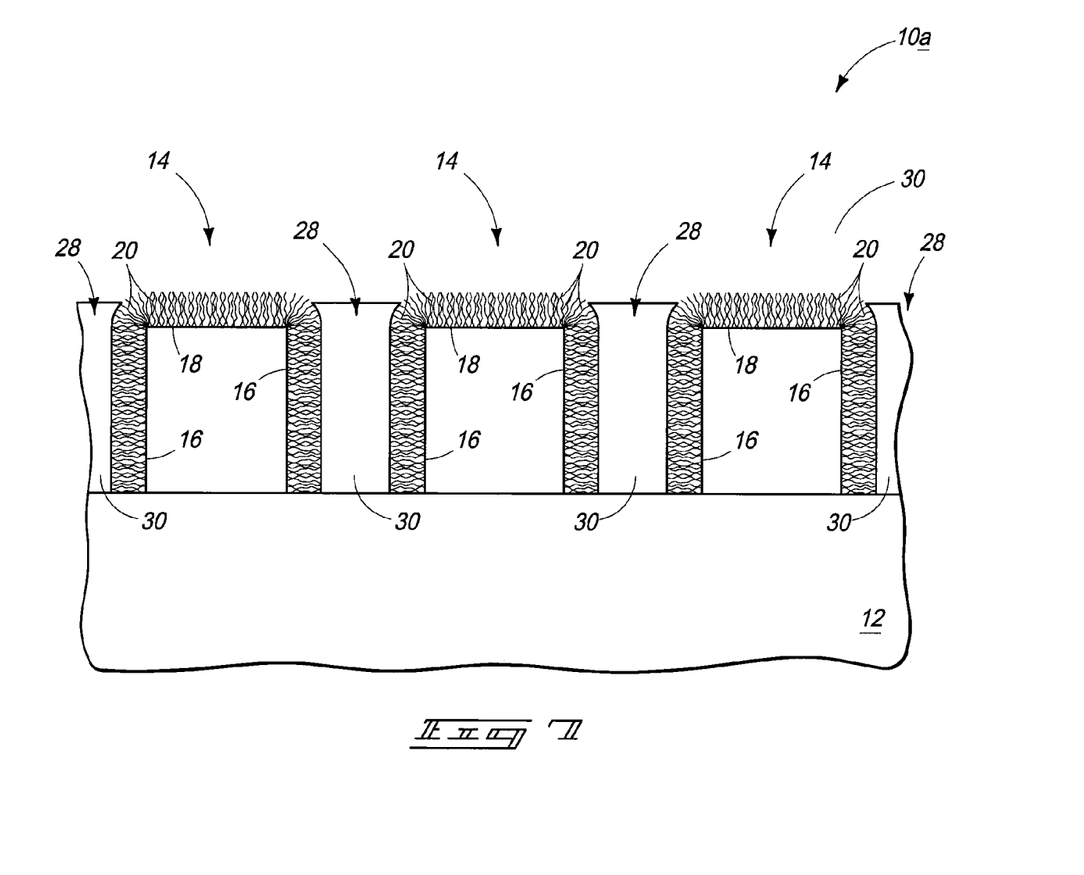
FIG. 7 is a view of the FIG. 6 substrate at a processing step subsequent to that shown by FIG. 6.
Figure 8:
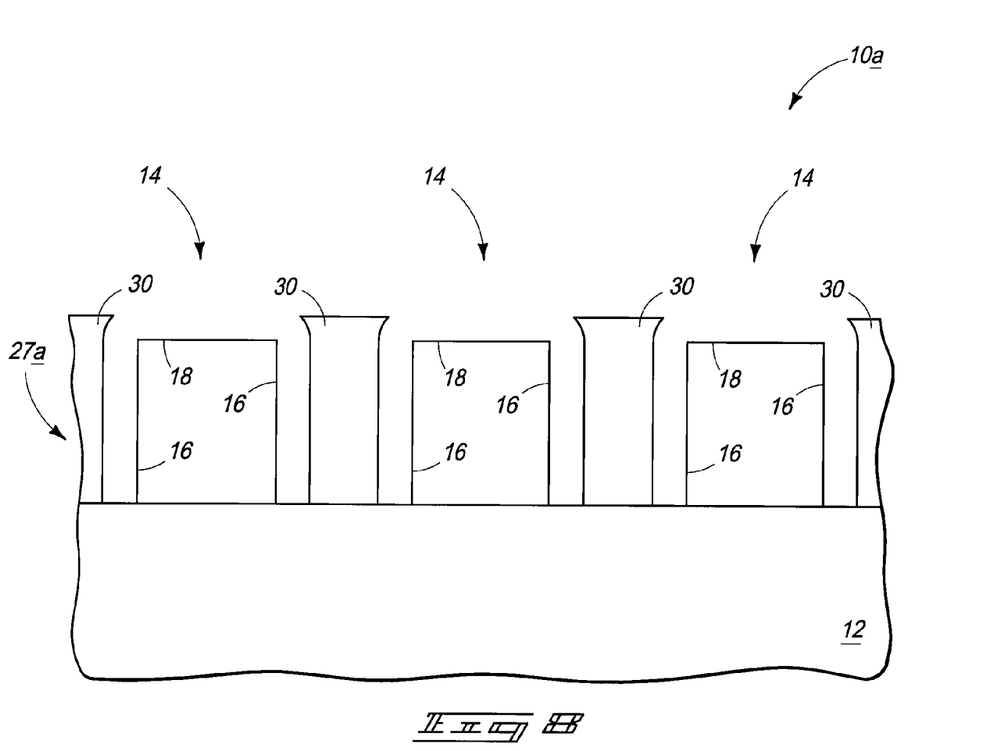
FIG. 8 is a view of the FIG. 7 substrate at a processing step subsequent to that shown by FIG. 7.

In one embodiment, material of the adsorbed polymer may be removed selectively relative to the spaced features, for example as shown with respect to a substrate fragment 10*a* in an embodiment of FIGS. 6-8. Like numerals from the above-described embodiments have been utilized where appropriate, with differences being indicated with the suffix "a" or with different numerals. FIG. 6 depicts alternate processing subsequent to that shown by FIG. 2. A fill material 30 has been deposited to within void spaces 28, over spaced features 14, and over adsorbed polymer 20. Fill material 30 may be homogenous or non-homogenous, and may be of the same or different composition from that of elevational outer surfaces 18 and/or surfaces 16 of spaced features 14.

Referring to FIG. 7, fill material 30 has been removed to expose adsorbed polymer 20 and leave fill material 30 within void spaces 28. Such may occur by etching and/or polishing action. Where polymer 20 is received over elevational outer surfaces 18 of spaced features 14 (as shown), such removing may (not shown) or may not (as shown) expose spaced features 14. Even if polymer 20 is adsorbed to elevationally outer surfaces 18 of spaced features 14 as shown, such polymer may be removed, for example by etching (not shown) to expose spaced features 14. Regardless, at some point, either spaced features 14 are selectively removed relative to adsorbed polymer 20 or material of adsorbed polymer 20 is selectively removed relative to spaced features 14 to form a pattern on substrate 12.

FIG. 8 depicts example subsequent processing to that shown by FIG. 7 wherein adsorbed polymer 20 (not shown) has been selectively removed relative to spaced features 14 as well as to fill material 30, thus forming a pattern 27a on underlying substrate 12. Any of the resultant patterns (i.e, patterns 27 or 27a) may be used as a mask pattern for use in further processing substrate 12 there-through, for example by etching, ion implantation, or any other method whether existing or yet-to-be developed. Alternately as described above, the spaced features may comprise sites for subsequent chemical modification or selective chemical processing, for example staining for enhanced etch selectivity or for selective deposition of functional components in directed self-assembly.

Figure 9:
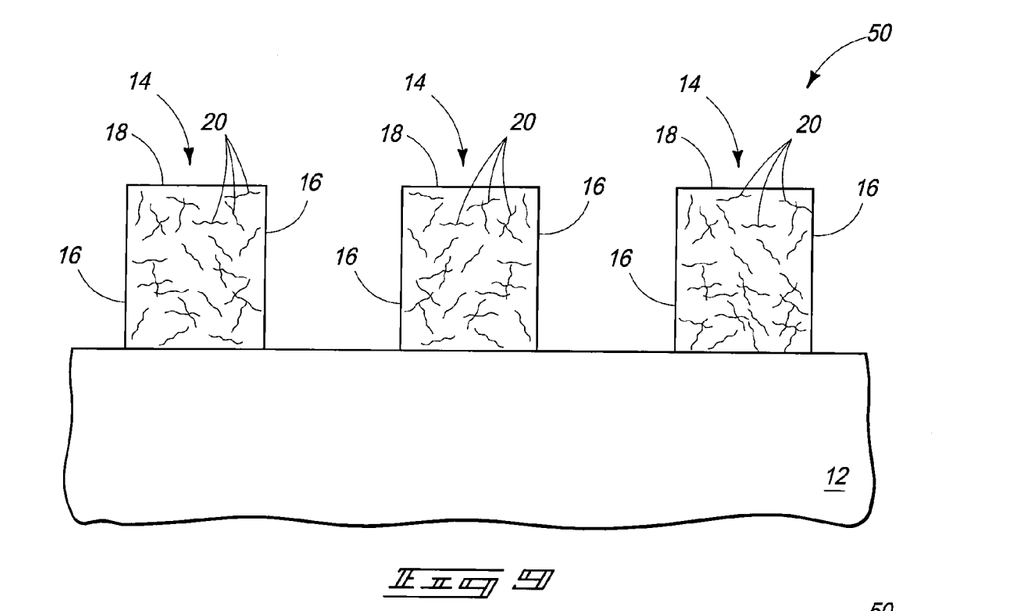
FIG. 9 is a diagrammatic sectional view of a substrate in process in accordance with an embodiment of the invention.
Figure 12:
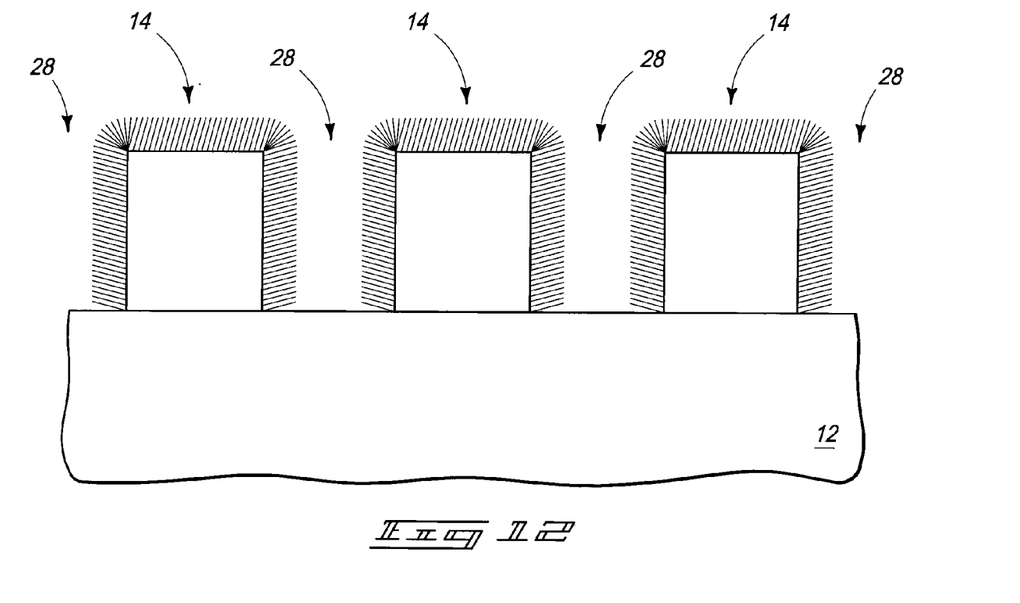
FIG. 12 is a view of an alternate embodiment substrate to that of FIG. 2.
Figure 13:
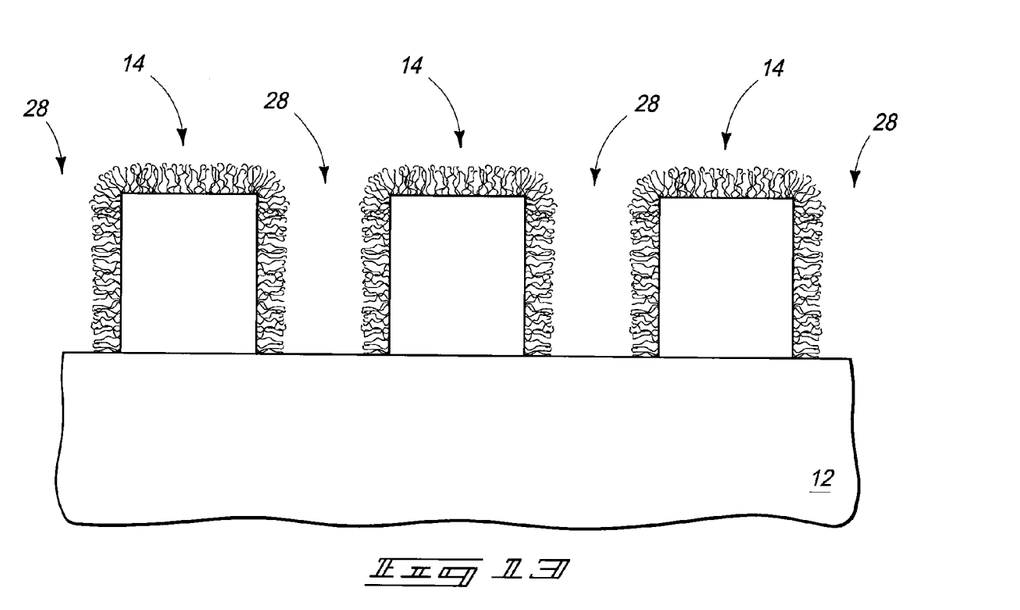
FIG. 13 is a view of another alternate embodiment substrate to that of FIG. 2.

Adsorption of polymer 20 to outer lateral surfaces 16, and in some embodiments also to elevational outer lateral surfaces 18, may be accomplished in the following manners, and by way of example only. FIG. 9 is used to explain one example with respect to a substrate fragment 50 which may be substrate 10 of FIG. 1. FIG. 9 depicts substrate 50 as comprising spaced features 14 comprising polymer 20 therewithin. An example concentration range of polymer to be adsorbed within photoresist-comprising spaced features 14 is from 0.001% to 5.0% by weight. Polymer 20 may or may not be homogenously distributed within spaced features 14. Regardless, substrate 50 may be processed to move polymer 20 to adsorb at least to outer lateral surfaces 16 of spaced features 14. In one embodiment, the polymer is driven to project lengthwise from outer surfaces of the spaced features. FIGS. 2, 12 and 13 depict such example embodiments wherein lengthwise projection is shown and relative to outer surfaces encompassed by both lateral surfaces 16 and elevational outer surfaces 18. FIGS. 2, 12, and 13 also depict examples wherein no part of polymer 20 remains within solid features 14.

Figure 10:
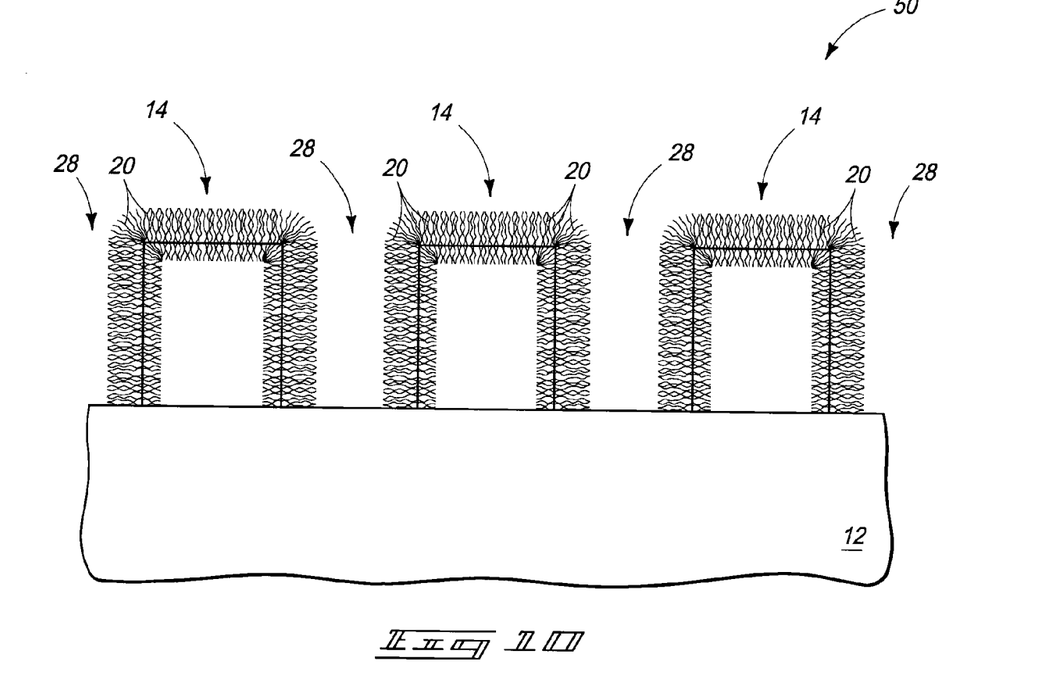
FIG. 10 is a view of the FIG. 9 substrate at a processing step subsequent to that shown by FIG. 9.

Alternate processing is contemplated, for example as shown in FIG. 10. In FIG. 10, one longitudinal end part of polymer 20 is miscible in and remains within solid features 14 and another longitudinal end part of polymer 20 opposite the one end is immiscible in features 14 and projects from the solid feature outer surfaces, for example in one embodiment from both lateral surfaces 16 and elevational surface 18. By way of example only, such may occur when using certain diblock copolymers received within features 14 where one of the diblocks is immiscible or phobic to the other material of spaced features 14 and the other diblock is neutral, philic, or miscible to the other material of features 14. Such may occur spontaneously or a suitable elevated temperature may be provided over a suitable time period to produce the structure of FIG. 10 from that of FIG. 9. An example range of heating is from about 100° C. to about 300° C. for anywhere from 5 seconds to 10 minutes. Then, processing may otherwise occur for example as shown in any of FIGS. 4-8 of the above-described embodiments. Further, by way of example only, the FIG. 2 construction as one example may be produced by suitable heating of the substrate for a suitable period of time depending upon polymer and composition of the spaced features.

Where heating is used to drive polymer to the feature surfaces, the track processing of the substrate with respect to photoresist processing may remain unchanged or include a post-develop bake. Regardless, a fundamental thermodynamic driving force and transport mechanism for the polymer in accordance with embodiments of the invention may be the same or analogous to the processing of top-coatless photoresist used in immersion lithography. In top-coatless immersion lithography, polymeric surfactants are blended with photoresist to provide hydrophobicity and eliminate the need for a separate top-coat layer, thus the name "top-coatless". Diffusion of the surfactant to the outer surface in top-coatless immersion lithography typically occurs during soft-bake prior to exposure to the immersion lithographic scanner. Top-coatless immersion lithography may or may not be used in embodiments of the invention. If used, in one embodiment, the immersion lithographic surfactant and polymer use of the invention may be blended as independent moieties within the photoresist and both respective functionalities realized. Alternately, in another embodiment, both functionalities may be incorporated within a single polymer, for example hydrophobicity for immersion scanning and polymer chain length for spacer formation about the features.

Figure 11:
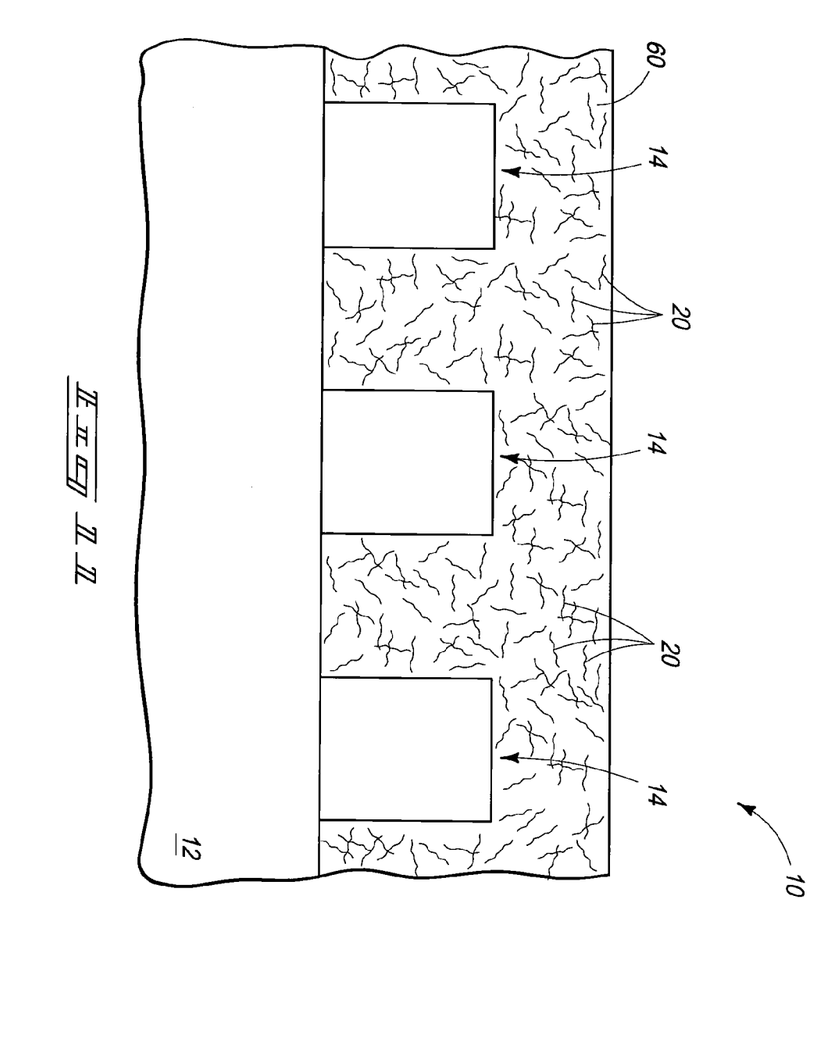
FIG. 11 is a diagrammatic sectional view of a substrate in process in accordance with an embodiment of the invention.

As alternate example processing, material of the spaced features as fabricated could be effectively void of the polymer which is to be adsorbed, and such polymer provided within a liquid which is applied to the spaced features. For example, FIG. 11 depicts substrate 10 of FIG. 1 having a liquid 60 which has been applied thereover. Such is depicted as comprising polymer 20 suspended therein. The processing of FIG. 11 can occur under suitable temperature, pressure, concentration, and time conditions whereby polymer adsorbing occurs and the structure of FIG. 2 results. Such may occur, by way of example only, during a post-develop rinse step. For example, the deionized water rinse step could be replaced or combined in a polymer-comprising deionized water rinse wherein a suitable polymer 20 therein selectively adsorbs to one or more outer lateral surfaces of spaced features 14. This may be in contrast to conventional surfactant rinses used in lithography where surfactant adsorbs to a water-air interface in order to reduce liquid surface tension for mitigating capillary collapse, and also the reduced tendency for fluid film break-up which may lead to droplet formation and possible watermark (doily) defects.

In one embodiment, if using immersion or dry lithography, the polymer to be adsorbed in accordance with the invention and a conventional surface tension reducing surfactant used in lithography may be blended in a single rinse fluid, and both functions (polymer adsorption and water surface tension reduction) are accomplished simultaneously during a single rinse step. By way of example, a suitable surfactant species could be perfluoroalkyl sulfonates ideally provided at a concentration below the critical micelle concentration.

The processing as described above with respect to FIGS. 9 and/or 10 may be combined with that described with respect to FIG. 11.

As mentioned above, the adsorbing may be by physisorbing and/or by chemisorbing in embodiments of the invention. Surface physisorption is typically driven by polar and dispersion forces wherein direct chemical bonds are not formed. Chemisorbing polymers may additionally or alternately be used. For example in such, a suitable group at one longitudinal end of the polymer molecule may react to form a covalent bond with chemical functionality present at the surface of the masking material, for example photoresist, with the remaining portion of the polymer molecule being outer surface-phobic. Such chemisorbed polymer films may consist of self-assembled monolayers. Example self-assembled monolayer-forming materials that are expected to provide etch selectivity are trichlorosiloxanes where, for example, the trichloro group would bind with resist and the siloxane chain would provide etch selectivity to carbonaceous resist molecules.

In one embodiment in accordance with the invention, a method of forming a pattern on a substrate comprises forming spaced solid features over a substrate. Size of the spaced solid features is expanded without depositing separate solid material thereover. In one embodiment, spaced feature size is expanded without depositing liquid material thereover. The embodiments as described with reference to FIGS. 9 and 10 are examples. In one embodiment, the expanding results at least in part from depositing liquid material thereover. The embodiment of FIG. 11 is one such example.

Regardless, where the spaced solid features comprise a suitable polymer, the expanding may comprise thermally driving the polymer within the solid features to project lengthwise from outer surfaces of the sold features. In one embodiment, the outer surfaces are of an unexpanded portion of the features, with one longitudinal end part of the polymer remaining within the unexpanded portion of the solid features and another longitudinal end part of the polymer opposite the one end projecting from the outer surfaces of the solid features. FIG. 10 is such an example. Alternately, no part of the polymer may remain within the unexpanded portion of the solid features, for example as shown in the embodiment of FIG. 2. Regardless, in one embodiment, the size expansion is void of chemical reaction of the solid features with any matter received thereover.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming spaced features over a substrate;
    adsorbing longitudinally elongated polymer molecules to opposing outer lateral surfaces of the spaced features, the polymer molecules individually having opposing longitudinal ends, one of the opposing ends of the individual polymer molecules being adsorbed to one of the opposing outer lateral surfaces whereby the individual polymer molecules project lengthwise from the outer lateral surface to which the individual polymer molecule is adsorbed; and
    removing either material of the spaced features selectively relative to the adsorbed polymer molecules or material of the adsorbed polymer molecules selectively relative to the spaced features to form a pattern on the substrate.

2. The method of claim 1 wherein the adsorbing comprises physisorbing.

3. The method of claim 1 wherein the adsorbing comprises chemisorbing.

4. The method of claim 1 wherein the polymer molecules are of known uniform chain length defining a substantially uniform lateral thickness of the adsorbed polymer molecules on the spaced features.

5. The method of claim 1 wherein the one longitudinal end is philic to composition of the outer lateral surface to which the polymer molecule is adsorbed.

6. The method of claim 1 wherein the one longitudinal end is philic to composition of the outer lateral surface to which the polymer molecule is adsorbed, and the other of the opposing longitudinal ends is phobic to the composition of the outer lateral surface to which the polymer molecule is adsorbed.

7. The method of claim 1 comprising removing material of the spaced features selectively relative to the adsorbed polymer molecules.

8. The method of claim 1 comprising removing material of the adsorbed polymer molecules selectively relative to the spaced features.

9. The method of claim 1 comprising adsorbing the polymer molecules to elevationally outer surfaces of the spaced features.

10. The method of claim 1 wherein the pattern is a mask pattern, and further comprising processing the substrate through the mask pattern.

11. The method of claim 1 wherein the pattern is formed to comprise sites for one of subsequent a) chemical modification, b) selective chemical processing, and c) selective deposition of functional components in directed self-assembly.

12. The method of claim 1 wherein the outer lateral surfaces comprise photoresist.

13. The method of claim 1 wherein the polymer molecules form a polymer which is an oligomer.

14. The method of claim 1 wherein the polymer molecules form a polymer which is an amphiphile.

15. The method of claim 1 wherein all polymer molecules adsorbed to the outer lateral surfaces consists essentially of a single composition.

16. The method of claim 1 wherein the other of the opposing longitudinal ends is phobic to composition of the outer lateral surface to which the polymer molecule is adsorbed.

17. The method of claim 16 wherein the other longitudinal end is hydrophobic.

18. The method of claim 1 wherein the polymer molecules form a polymer which is a copolymer.

19. The method of claim 18 wherein the polymer is a block copolymer.

20. The method of claim 18 wherein the polymer is a graft copolymer.

21. The method of claim 1 wherein the lengthwise projection of the individual polymer molecules is at a uniform angle from the outer lateral surface to which the individual polymer molecule is adsorbed.

22. The method of claim 21 wherein the angle is orthogonal from the outer lateral surface to which the individual polymer molecule is adsorbed.

23. The method of claim 21 wherein the angle is other than orthogonal from the outer lateral surface to which the individual polymer molecule is adsorbed.

24. The method of claim 1 comprising:
    providing a void space between immediately adjacent of the spaced features having polymer molecules adsorbed thereto;
    depositing fill material to within the void space, over the spaced features, and over the adsorbed polymer molecules; and
    removing the fill material to expose the adsorbed polymer molecules and leave fill material within the void space.

25. The method of claim 24 wherein the fill material is of the same composition as that of elevational outer surfaces of the spaced features.

26. The method of claim 24 wherein the fill material is of different composition from that of elevational outer surfaces of the spaced features.

27. The method of claim 24 comprising removing material of the adsorbed polymer molecules selectively relative to the spaced features and the fill material.

28. The method of claim 24 wherein the fill material as-deposited completely fills the void space.

29. The method of claim 24 comprising removing the fill material to expose the spaced features and leave fill material within the void space.

30. The method of claim 29 comprising adsorbing the polymer molecules to elevationally outer surfaces of the spaced features, the depositing forming the fill material over the polymer molecules adsorbed to said elevationally outer surfaces, the removing including removal of the polymer molecules adsorbed to said elevationally outer surfaces which exposes the spaced features.

31. A method of forming a pattern on a substrate, comprising:
forming spaced solid features over a substrate; and
expanding size of the spaced solid features without depositing separate solid material thereover, without depositing liquid material thereover, and without heating the substrate during said expanding; and
after the expanding, removing laterally central portions of the expanded spaced solid features selectively relative to laterally outermost portions of the expanded spaced solid features.

32. The method of claim 31 wherein the expanding is void of chemical reaction of the solid features with any matter thereover.

33. The method of claim 31 wherein the pattern is a mask pattern, and further comprising processing the substrate through the mask pattern.

34. The method of claim 31 wherein the pattern is formed to comprise sites for one of subsequent a) chemical modification and b) selective deposition of functional components in directed self-assembly.

35. A method of forming a pattern on a substrate, comprising:
forming spaced solid features over a substrate, the spaced solid features comprising outer surfaces and comprising longitudinally elongated polymer molecules; and
expanding size of the spaced solid features, the expanding comprising thermally driving the polymer molecules within the solid features to project lengthwise from the outer surfaces of the solid features.

36. The method of claim 35 wherein the outer surfaces are of an unexpanded portion of the features, one longitudinal end part of individual of the polymer molecules remaining within the unexpanded portion of the solid features and another longitudinal end part of individual of the polymer molecules opposite the one projecting from the outer surfaces of the solid features.

37. The method of claim 35 wherein the outer surfaces are of an unexpanded portion of the features, no part of the polymer molecules remaining within the unexpanded portion of the solid features.

38. A method of forming a pattern on a substrate, comprising:
forming spaced features over a substrate, the features comprising longitudinally elongated polymer molecules there-within;
driving the polymer molecules to project lengthwise from outer surfaces of the spaced features; and
removing either material of the spaced features selectively relative to the polymer molecules or material of the polymer molecules selectively relative to the spaced features to form a pattern on the substrate.

39. The method of claim 38 wherein the polymer molecules are homogenously distributed within the spaced features at some time prior to the driving.

40. The method of claim 38 wherein one longitudinal end part of individual of the polymer molecules remains within the spaced features and another longitudinal end part of individual of the polymer molecules opposite the one projects from the outer surfaces of the spaced features.

41. The method of claim 38 wherein no part of the polymer molecules remain within the spaced features.

42. A method of forming a pattern on a substrate, comprising:
forming spaced features over a substrate;
applying liquid to the spaced features to adsorb longitudinally elongated polymer molecules from within the liquid onto outer lateral surfaces of the spaced features, the polymer molecules projecting lengthwise from the outer lateral surfaces of the spaced features; and
removing either material of the spaced features selectively relative to the adsorbed polymer molecules or material of the adsorbed polymer molecules selectively relative to the spaced features to form a pattern on the substrate.

43. The method of claim 42 wherein the spaced features are void of the polymer molecules prior to the applying.

44. The method of claim 42 wherein the applying comprises a rinse with deionized water containing the polymer molecules.

45. A method of forming a pattern on a substrate, comprising:
forming spaced solid features over a substrate, the spaced solid features comprising outer surfaces and comprising longitudinally elongated polymer molecules; and
expanding size of the spaced solid features, the expanding comprising driving the polymer molecules within the solid features to project lengthwise from the outer surfaces of the solid features.

46. The method of claim 45 wherein the outer surfaces are of an unexpanded portion of the features, one longitudinal end part of individual of the polymer molecules remaining within the unexpanded portion of the solid features and another longitudinal end part of individual of the polymer molecules opposite the one projecting from the outer surfaces of the solid features.

47. The method of claim 45 wherein the outer surfaces are of an unexpanded portion of the features, no part of the polymer molecules remaining within the unexpanded portion of the solid features.

* * * * *